United States Patent
Kim

(10) Patent No.: US 7,106,612 B2
(45) Date of Patent: Sep. 12, 2006

(54) SEMICONDUCTOR MEMORY DEVICE USING TAPERED ARRANGEMENT OF LOCAL INPUT AND OUTPUT SENSE AMPLIFIERS

(75) Inventor: Youn-cheul Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 34 days.

(21) Appl. No.: 11/043,935

(22) Filed: Jan. 28, 2005

(65) Prior Publication Data

US 2005/0169079 A1    Aug. 4, 2005

(30) Foreign Application Priority Data

Jan. 29, 2004    (KR) .................. 10-2004-0005648

(51) Int. Cl.
*G11C 5/06* (2006.01)
(52) U.S. Cl. ................... 365/63; 365/230.03
(58) Field of Classification Search .............. 365/63, 365/230.03, 205, 207, 208
See application file for complete search history.

(56) References Cited

U.S. PATENT DOCUMENTS

| | | | |
|---|---|---|---|
| 4,730,280 A | 3/1988 | Aoyama | |
| 5,926,431 A * | 7/1999 | Toda | 365/230.03 |
| 6,215,718 B1 * | 4/2001 | Koelling | 365/230.03 |
| 6,233,196 B1 * | 5/2001 | Lee | 365/230.03 |
| 6,278,650 B1 | 8/2001 | Kang | |

FOREIGN PATENT DOCUMENTS

| | | |
|---|---|---|
| JP | 2000215669 A | 8/2000 |
| KR | 10-0335493 | 5/2001 |
| KR | 2001-0059962 A | 7/2001 |

* cited by examiner

*Primary Examiner*—Vu A. Le
(74) *Attorney, Agent, or Firm*—Volentine Francos & Whitt

(57) ABSTRACT

A semiconductor memory device optimizes current consumption by using proper sub-bank arrangement and at least two different kinds of LIO sense amplifiers having different driving capabilities. The driving capabilities of the LIO sense amplifiers are controlled in a tapered manner depending on whether a corresponding sub-bank of the LIO sense amplifier is arranged nearer to, or farther away from, its corresponding GIO sense amplifier. In other words, the farther that a sub-bank of an LIO sense amplifier is away from its corresponding GIO sense amplifier, the greater its driving capability.

6 Claims, 5 Drawing Sheets

SEMICONDUCTOR MEMORY DEVICE USING TAPERED ARRANGEMENT OF LOCAL INPUT AND OUTPUT SENSE AMPLIFIERS

CROSS REFERENCES TO RELATED APPLICATIONS

This application claims priority under 35 U.S.C. § 119 from Korean Patent Application No. 04-5648, filed on Jan. 29, 2004, the contents of which are hereby incorporated by reference in their entirety for all purposes as if fully set forth herein.

BACKGROUND AND SUMMARY

1. Technical Field.

The present invention relates to a semiconductor memory device, and more particularly, to a memory architecture using a tapered arrangement of local input & output (LIO) sense amplifiers.

2. Description of the Related Art.

FIG. 1 shows a block diagram of a dynamic random access memory (DRAM) core of a conventional semiconductor memory device.

From FIG. 1, one can recognize paths for reading cell data from the banks 0-2 and 2-1 in a conventional DRAM core 100 comprising a plurality of banks.

In order to read out one or a plurality of data from the memory cells of the semiconductor memory device, the data stored in the cells should be amplified in a bitline sense amplifier. The data amplified in the bitline sense amplifier are transferred to an LIO bus via a column selection line (CSL) switch, amplified in an LIO sense amplifier connected to the LIO bus, and then transferred to a global input & output (GIO) bus. According to a typical DRAM core architecture, the GIO bus is driven by the LIO sense amplifiers having the same line driving capabilities.

When the data stored in the memory cells are read out to external circuits, the cell data in the bank 0-2 should be transferred from a starting point of the GIO bus via the overall GIO bus line to the GIO sense amplifier while the cell data in the bank 2-1 should be transferred from the middle of the GIO bus via a part of the GIO bus line to the GIO sense amplifier. In other words, the path by which the data in the bank 0-2 are transferred to the GIO sense amplifier is longer than the path by which the data in the bank 2-1 are transferred to the GIO sense amplifier.

In the above condition, it is assumed that the LIO sense amplifiers have the same line driving capabilities for amplifying the cell data and transferring the amplified data to the GIO bus.

The time for reading the cell data is related to the product of the line resistance and line capacitance of the portion of the GIO bus forming the data transfer path. Therefore, as the transfer path becomes longer, the line resistance and the line capacitance are relatively increased and the time for outputting corresponding data are also increased. Based on the above facts, it is apparent that the time for reading the data from the bank 0-2 is longer than that from the bank 2-1. Similarly, the times for reading cell data from the banks 1-2, 2-2, and 3-2 are relatively longer than those from the banks 3-1, 0-1, and 1-1.

In order to compensate for such time differences, it is possible to design the driving capabilities of the LIO sense amplifiers by considering the longest one of the cell data transfer paths. However, the chip size corresponding to an amplifier, particularly a transistor for an output driving part, must be large to implement an amplifier with a large driving capability. Also, power consumption of the amplifier is increased.

Therefore, the conventional LIO sense amplifier arrangement is not appropriate for the current technical trend requiring minimization and lower power consumption.

Accordingly, it would be desirable to provide a semiconductor memory device capable of optimizing current consumption by using proper sub-bank arrangement and at least two different kinds of LIO sense amplifiers which are installed in each sub-bank and which have different driving capabilities.

According to one aspect of the present invention, a semiconductor memory device comprises: a plurality of banks, each bank comprising a pair of sub-banks; a plurality of LIO (local input & output) sense amplifiers installed in the sub-banks, the LIO sense amplifiers sensing and amplifying data stored in memory cells of the sub-banks; and a plurality of GIO (global input & output) sense amplifiers installed between the plurality of banks, the plurality of GIO sense amplifiers sensing and amplifying outputs from the plurality of LIO sense amplifiers.

Beneficially, the LIO sense amplifiers are arranged in such a way that the driving capabilities of the LIO sense amplifiers for the sub-banks arranged farther from the GIO sense amplifiers are greater than those for the sub-banks arranged nearer to the GIO sense amplifiers, and the driving capabilities of the LIO sense amplifiers are the same as each other within each particular sub-bank.

The pair of sub-banks may be diagonally arranged with respect to a center of the banks, one of the pair of sub-banks being arranged farther from a corresponding GIO sense amplifier and the other of the pair of sub-banks being arranged nearer to the corresponding GIO sense amplifier.

According to another aspect of the present invention, there is provided a semiconductor memory device comprising: a plurality of banks, each bank comprising a pair of sub-banks; a plurality of LIO sense amplifiers installed in the sub-banks, the plurality of LIO sense amplifiers sensing and amplifying data stored in memory cells of the sub-banks; and a plurality of GIO sense amplifiers installed between the plurality of banks, the plurality of GIO sense amplifiers sensing and amplifying outputs of the plurality of LIO sense amplifiers.

Beneficially, the LIO sense amplifiers are arranged in such a way that driving capabilities of the LIO sense amplifiers installed in the sub-banks arranged farther from the GIO sense amplifiers are greater than driving capabilities of the LIO sense amplifiers installed in the sub-banks arranged nearer to the GIO sense amplifiers and driving capabilities of the LIO sense amplifiers are the same as each other within each particular sub-bank.

Also beneficially, driving capabilities of the LIO sense amplifiers in a same row are the same as each other.

Each of the sub-banks may be arranged in such a way that the sub-banks of a particular bank are arranged in the same row or column on the basis of the arranged banks and diagonally arranged in the row or the column, one of the pair of the sub-banks being arranged farther from the GIO sense amplifier, and the other of the pair of the sub-banks is arranged nearer to the GIO sense amplifier.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
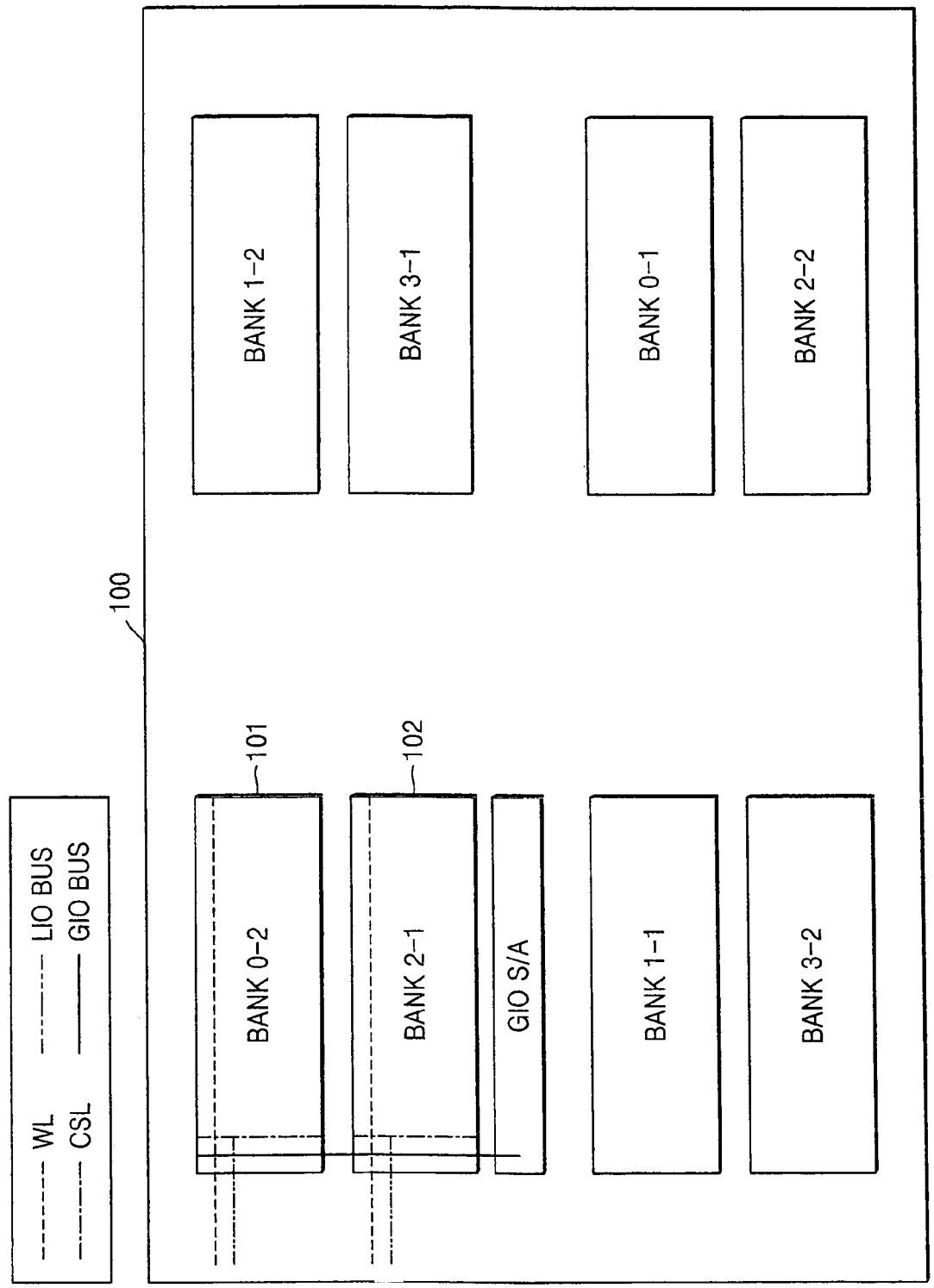
FIG. 1 is a block diagram showing a DRAM (dynamic random access memory) core of a conventional semiconductor memory device.

In the description to follow, the same or similar elements are indicated in the drawings by the same reference numerals.

Figure 2:
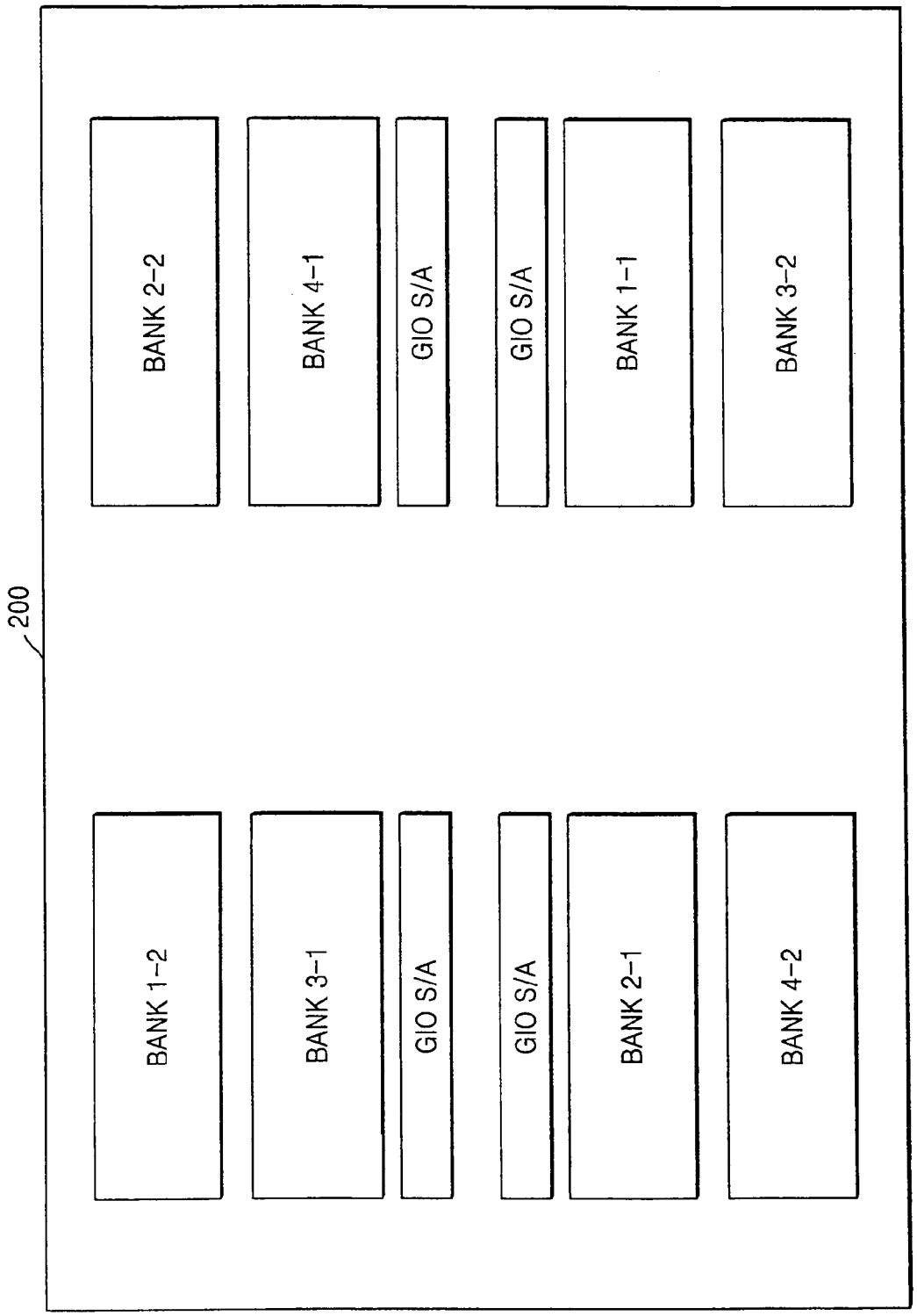
FIG. 2 is a block diagram showing a first embodiment of a structure of a semiconductor memory device according to one or more aspects of the present invention.

FIG. 2 shows a block diagram of a semiconductor memory device 200 comprising four banks, 1 through 4. Furthermore, each bank comprises a pair of sub-banks.

The first bank 1 comprises a first sub-bank BANK 1-1 arranged nearer to the global input & output (GIO) sense amplifier S/A, and a second sub-bank BANK 1-2 arranged farther away from the GIO sense amplifier S/A.

Similarly, the second bank 2 comprises a first sub-bank BANK 2-1 arranged nearer to the GIO sense amplifier S/A and a second sub-bank BANK 2-2 arranged farther away from the GIO sense amplifier S/A.

Similarly, the third bank 3 comprises a first sub-bank BANK 3-1 arranged nearer to the GIO sense amplifier S/A and a second sub-bank BANK 3-2 arranged farther away from the GIO sense amplifier S/A.

Similarly, the fourth bank 4 comprises a first sub-bank BANK 4-1 arranged nearer to the GIO sense amplifier S/A and a second sub-bank BANK 4-2 arranged farther away from the GIO sense amplifier S/A.

Beneficially, the pair of sub-banks of each bank are diagonally arranged with respect to the center of the structure. Furthermore, one of the pair of sub-banks is arranged farther away from the GIO sense amplifier while the other of the pair of sub-banks is arranged nearer to the GIO sense amplifier. This arrangement causes the power consumption for amplifying cell data to be constant all over the structure.

Herein, the driving capabilities of the local input & output (LIO) sense amplifiers installed in the first sub-banks BANK 1-1 through BANK 4-1 are smaller than those installed in the second sub-banks BANK 1-2 through 4-2. Also, the driving capabilities of the LIO sense amplifiers are identical to each other within each particular sub-bank.

Figure 3:
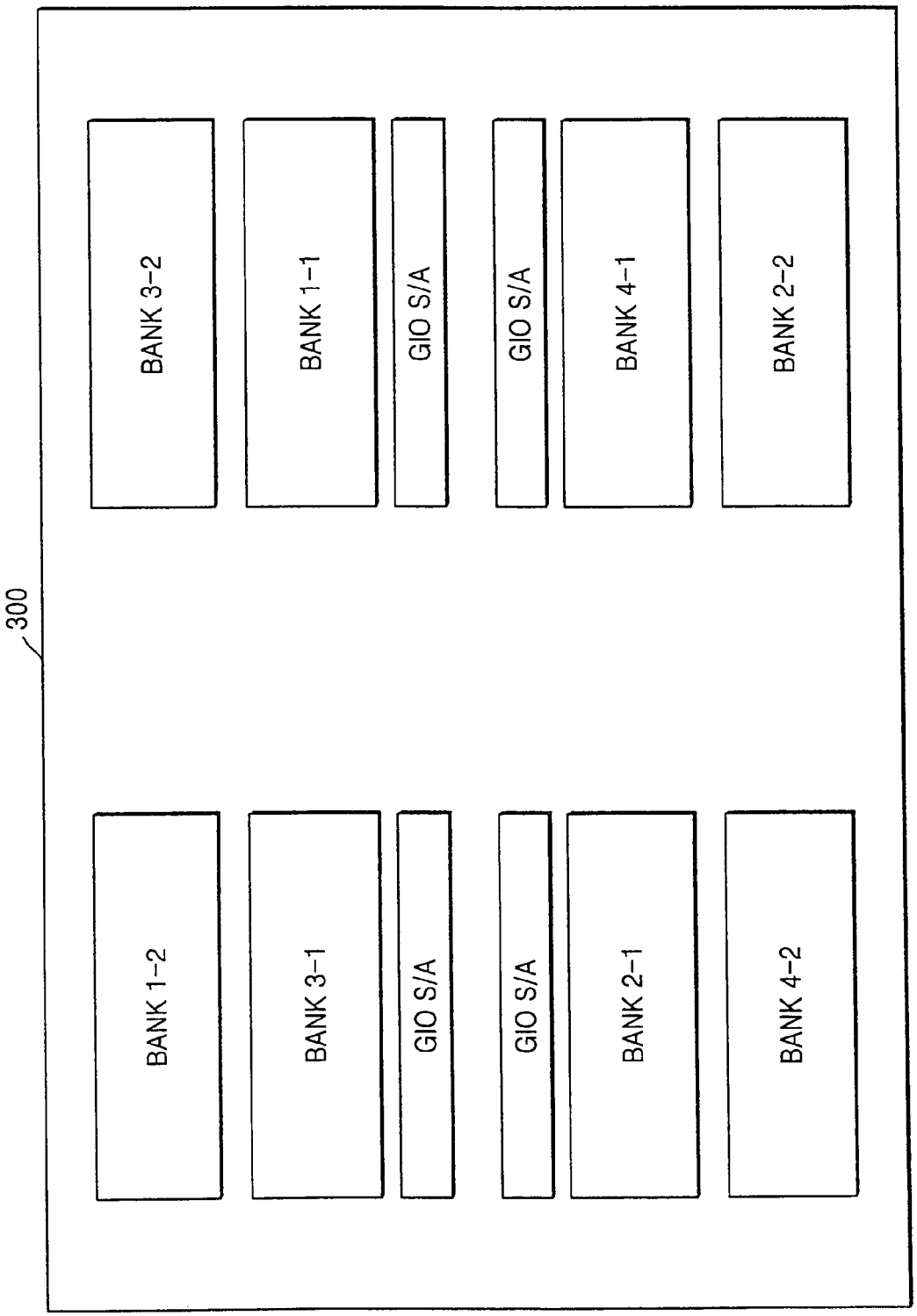
FIG. 3 is a block diagram showing a second embodiment of a structure of a semiconductor memory device according to one or more aspects of the present invention.

Referring to FIG. 3, the semiconductor memory device 300 comprises four banks 1 through 4, and each bank comprises a pair of sub-banks.

The first bank 1 comprises a first sub-bank BANK 1-1 arranged nearer to the GIO sense amplifier S/A and a second sub-bank BANK 1-2 arranged farther away from the GIO sense amplifier S/A.

Similarly, the second bank 2 comprises a first sub-bank BANK 2-1 arranged nearer to the GIO sense amplifier S/A and a second sub-bank BANK 2-2 arranged farther away from the GIO sense amplifier S/A.

Similarly, the third bank 3 comprises a first sub-bank BANK 3-1 arranged nearer to the GIO sense amplifier S/A and a second sub-bank BANK 3-2 arranged farther away from the GIO sense amplifier S/A.

Similarly, the fourth bank 4 comprises a first sub-bank BANK 4-1 arranged nearer to the GIO sense amplifier S/A and a second sub-bank BANK 4-2 arranged farther away from the GIO sense amplifier S/A.

The pair of sub-banks of each bank are diagonally arranged with respect to the center of the structure. However, in contrast to the arrangement in FIG. 2, in FIG. 3 the sub-banks of each bank are arranged in the same row and diagonally arranged with respect to the row. Although the drawing does not exemplify this detail, it would be appreciated that, alternatively, the sub-banks of each bank can be arranged in the same column and diagonally arranged with respect to the column.

Furthermore, one of the pair of sub-banks is arranged farther away from the GIO sense amplifier while the other of the pair of sub-banks is arranged nearer to the GIO sense amplifier. This makes the power consumption for amplifying cell data to be constant all over the structure.

Herein, the driving capabilities of the LIO sense amplifiers arranged in the first sub-banks 1-1 through 4-1 are smaller than those arranged in the second sub-banks 1-2 through 4-2. Also, the driving capabilities of the LIO sense amplifiers are identical within each sub-bank.

Figure 4:
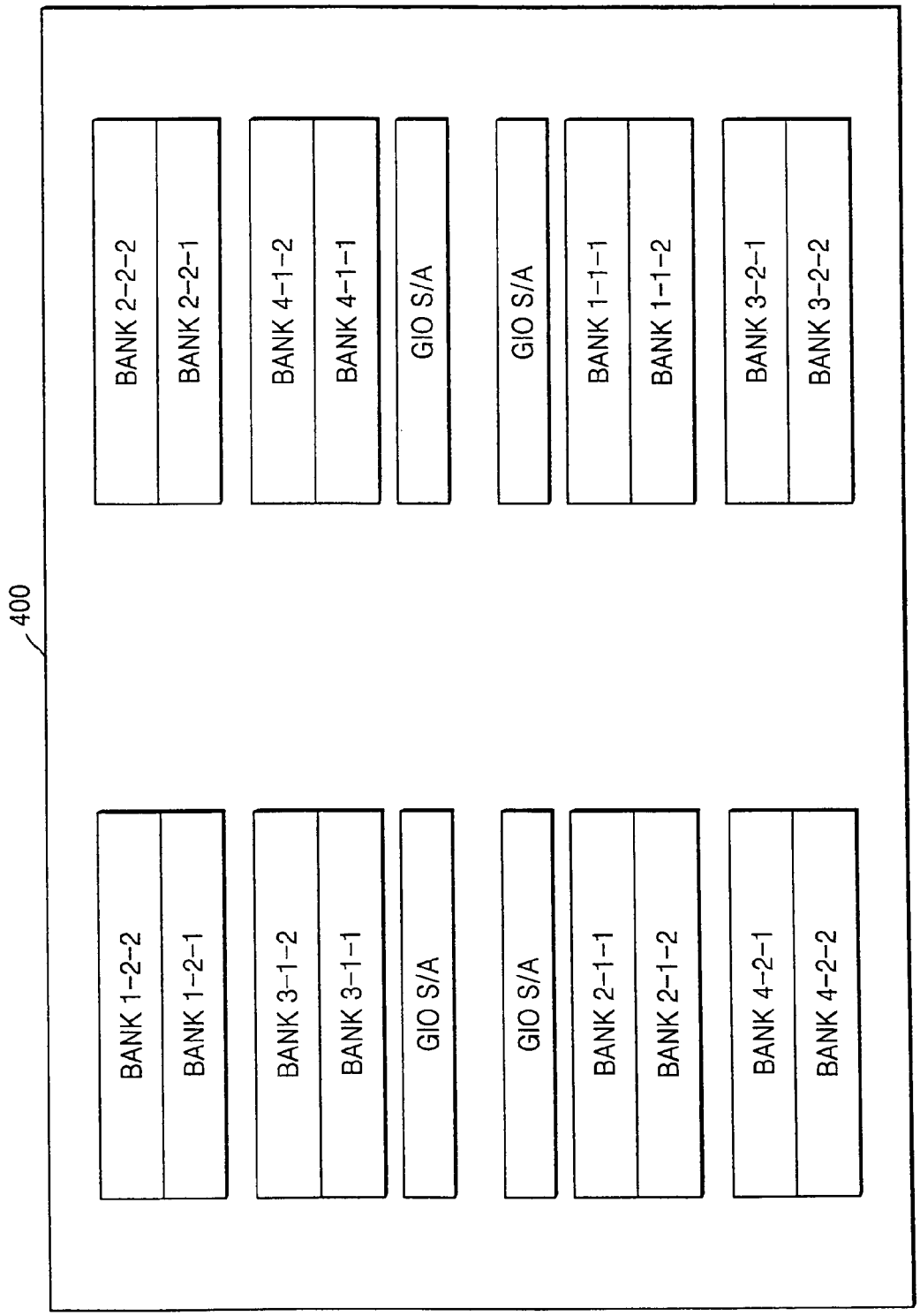
FIG. 4 is a block diagram showing a third embodiment of a structure of a semiconductor memory device according to one or more aspects of the present invention.

FIG. 4 shows a block diagram of a semiconductor memory device 400 comprising four banks, 1-4. Each bank comprises a pair of sub-banks. Furthermore, it is seen that each sub-bank of the semiconductor memory device 400 is further divided into two secondary sub-banks. Also, the driving capabilities of the LIO sense amplifiers for the secondary sub-banks are implemented in such a way that the one that is farthest from the GIO sense amplifier has a relatively greater drive capability.

The first bank will be explained in order to more fully describe the semiconductor memory device.

The first sub-bank BANK 1-1 of the first bank 1 comprises two secondary sub-banks BANK 1-1-1 and BANK 1-1-2. The driving capability of the LIO sense amplifier for the secondary sub-bank BANK 1-1-1 arranged nearer to the GIO sense amplifier is less than that for the secondary sub-bank BANK 1-1-2 arranged farther away from the GIO sense amplifier.

The second sub-bank BANK 1-2 of the first bank 1 comprises two secondary sub-banks BANK 2-1-1 and BANK 2-1-2. The driving capability of the LIO sense amplifier for the secondary sub-bank BANK 2-1-1 arranged nearer to the GIO sense amplifier is less than that for the secondary sub-bank BANK 2-1-2 arranged farther away from the GIO sense amplifier.

Figure 5:
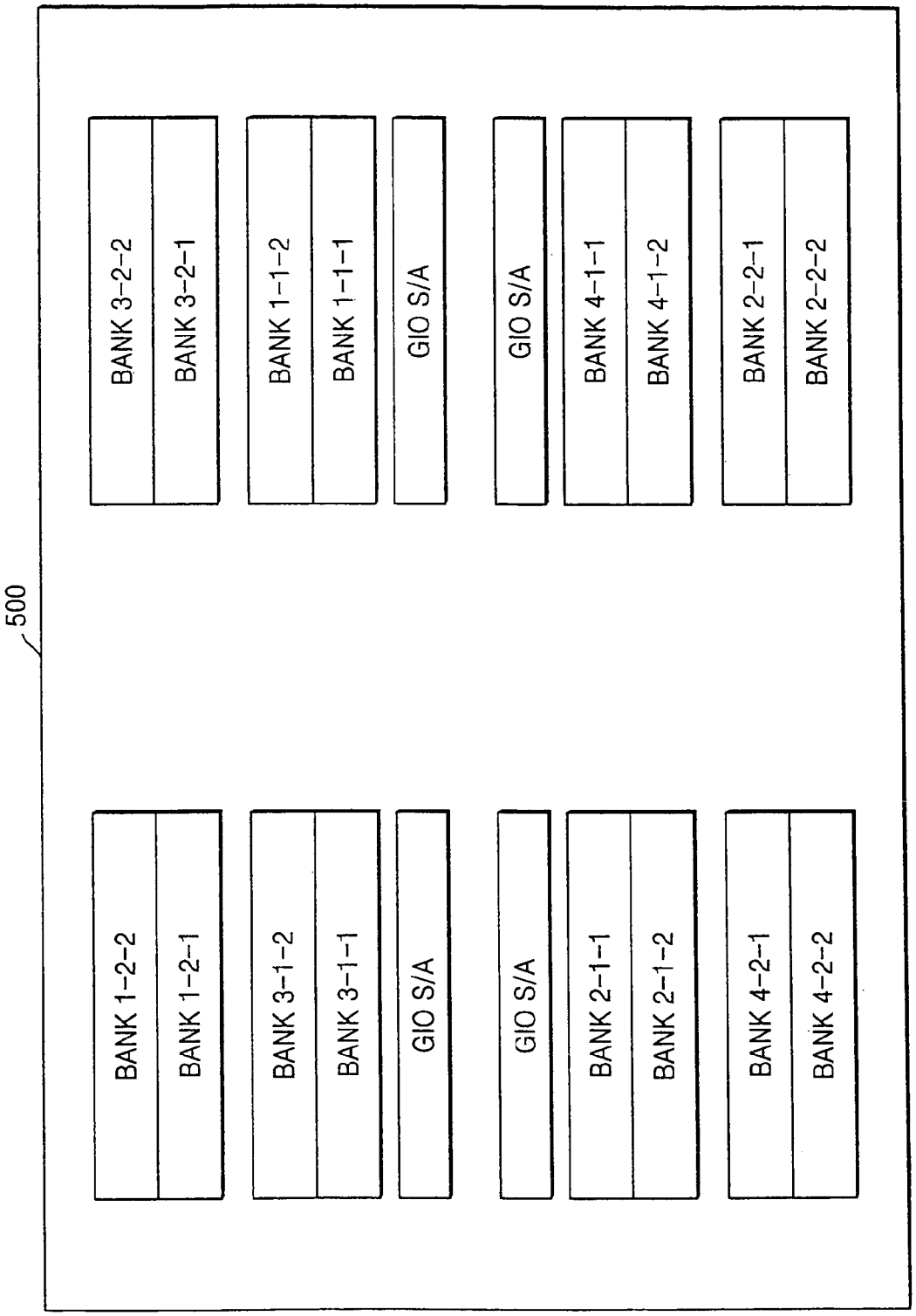
FIG. 5 is a block diagram showing a fourth embodiment of a structure of a semiconductor memory device according to one or more aspects of the present invention.

Referring to FIG. 5, it is seen that each sub-bank of the semiconductor memory device 500 is divided into a pair of secondary sub-banks. Also, the driving capabilities of the LIO sense amplifiers for each secondary sub-bank are implemented in such a way that the one that is farthest away from the GIO sense amplifier has an LIO sense amplifier with a relatively greater driving capability.

FIG. 5 can be easily understood by referring to the above explanation for FIG. 4.

Accordingly, the LIO sense amplifiers are arranged in a tapered manner depending on whether a corresponding sub-bank is closer to, or farther away from, the GIO sense amplifier. In other words, the LIO sense amplifier arranged farthest away from the GIO sense amplifier has a relatively greater driving capability. This will optimize consumption of any charge that has been pre-charged in the GIO line, and thus optimize current consumption. Also, for cell arrangement in a bank, half of the cells are arranged at a farther side from the GIO line, and the other half of the cells are arranged at a nearer side to the GIO line. Therefore, the current consumption in the LIO sense amplifies is made to be constant or nearly so.

Therefore, it is possible to optimize current consumption. The driving capabilities of the LIO sense amplifiers are controlled in a tapered manner depending on whether a corresponding sub-bank of the LIO sense amplifier is arranged nearer to, or farther away from, its corresponding GIO sense amplifier. In other words, the farther that a sub-bank of an LIO sense amplifier is away from its corresponding GIO sense amplifier, the greater its driving capability.

Embodiments of the present invention are disclosed in the drawings and the specification, as described above. In addition, although specific terms have been used hereto, the terms are intended to explain the present invention, but not intended to limit a meaning or restricting the scope of the present invention written in the following claims. Accordingly, it will be understood by those of ordinary skill in the art that various changes in form and details may be made therein without departing from the spirit and scope of the present invention as defined by the following claims.

What is claimed is:

1. A semiconductor memory device comprising:
   a plurality of banks, each bank comprising a pair of sub-banks;
   a plurality of LIO (local input & output) sense amplifiers installed in each of the sub-banks, the LIO sense amplifiers sensing and amplifying data stored in memory cells of the sub-banks; and
   a plurality of GIO (global input & output) sense amplifiers installed between the plurality of banks, the plurality of GIO sense amplifiers sensing and amplifying outputs from the plurality of LIO sense amplifiers,
   wherein the pair of sub-banks of each bank are diagonally arranged on opposite sides with respect to a center of the banks, one of the sub-banks of the pair being arranged farther away from its corresponding GIO sense amplifier than the other sub-bank of the pair is to its corresponding GIO sense amplifier, and
   wherein the LIO sense amplifiers are arranged in such a way that driving capabilities of the LIO sense amplifiers for the one sub-bank of each bank that is arranged farther way from its corresponding GIO sense amplifier are greater than driving capabilities of the LIO sense amplifiers for the other sub-bank of each bank that is arranged nearer to its corresponding GIO sense amplifier, and
   wherein, within each sub-bank, the driving capabilities of the LIO sense amplifiers are the same as each other.

2. The semiconductor memory device of claim 1, wherein
   the plurality of banks comprise first, second, third, and fourth banks,
   a first sub-bank of the third bank being arranged between a first one of the GIO sense amplifiers and a second sub-bank of the first bank and sharing the first GIO sense amplifier with the second sub-bank of the first bank,
   a first sub-bank of the fourth bank being arranged between a second one of the GIO sense amplifiers and a second sub-bank of the second bank and sharing the second GIO sense amplifier with the second sub-bank of the second bank,
   a first sub-bank of the second bank being arranged between a third one of the GIO sense amplifiers and a second sub-bank of the fourth bank and sharing the third GIO sense amplifier with the second sub-bank of the fourth bank,
   a first sub-bank of the first bank being arranged between a fourth one of the GIO sense amplifiers and the second sub-bank of the third bank and sharing the fourth GIO sense amplifier with the fourth sub-bank of the third bank,
   the second sub-bank of the first bank and the first sub-bank of the third bank being diagonally arranged with respect to the first sub-bank of the first bank and the second sub-bank of the third bank, respectively, and
   the first sub-bank of the second bank and the second sub-bank of the fourth bank being diagonally arranged with respect to the second sub-bank of the second bank and the first sub-bank of the fourth bank, respectively.

3. The semiconductor memory device according to claim 1, wherein
   the LIO sense amplifiers are implemented by more than two kinds of LIO sense amplifiers, each kind having a different driving capability, and
   each sub-bank of each bank that is farther away from the GIO sense amplifier than another sub-bank has a greater driving capability than that other sub-bank.

4. A semiconductor memory device comprising:
   a plurality of banks, each bank comprising a pair of sub-banks;
   a plurality of LIO sense amplifiers installed in the sub-banks, the plurality of LIO sense amplifiers sensing and amplifying data stored in memory cells of the sub-banks; and
   a plurality of GIO sense amplifiers installed between the plurality of banks, the plurality of GIO sense amplifiers sensing and amplifying outputs of the plurality of LIO sense amplifiers,
   wherein each of the sub-banks are arranged in such a way that the sub-banks of a particular bank are diagonally arranged in a same row or the column, one of the pair of the sub-banks being arranged farther away from its corresponding GIO sense amplifier, and the other of the pair of the sub-banks being arranged nearer to its corresponding GIO sense amplifier, and
   wherein the LIO sense amplifiers are arranged in such a way that driving capabilities of the LIO sense amplifiers for the one sub-bank of each bank that is arranged farther way from its corresponding GIO sense amplifier are greater than driving capabilities of the LIO sense amplifiers for the other sub-bank of each bank that is arranged nearer to its corresponding GIO sense amplifier, and
   wherein driving capabilities of the LIO sense amplifiers in a same row are the same as each other.

5. The semiconductor memory device according to claim 4, wherein
   the plurality of banks comprise first, second, third and fourth banks,
   a first sub-bank of the third bank being arranged between a first one of the GIO sense amplifiers and a second sub-bank of the first bank and sharing the first GIO sense amplifier with the second sub-bank of the first bank,
   a first sub-bank of the first bank being arranged between a second one of the GIO sense amplifiers and the second sub-bank of the third bank and sharing the second GIO sense amplifier with the second sub-bank of the third bank, a first sub-bank of the second bank being arranged between a third one of the GIO sense amplifiers and the second sub-bank of the fourth bank and sharing the third GIO sense amplifier with the second sub-bank of the fourth bank, a first sub-bank of the fourth bank being arranged between a fourth one of the GIO sense amplifiers and the second sub-bank of the second bank and sharing the fourth GIO sense amplifier with the second sub-bank of the second bank, the first sub-bank of the second bank and the first sub-bank of the third bank being arranged opposite to the second sub-bank of the third bank and the first sub-bank of the first bank, respectively, the first sub-bank of the second bank and the second sub-bank of the fourth bank being arranged opposite to the first sub-bank of the fourth bank and the second sub-bank of the second bank, respectively, the first sub-bank of the first bank and the second sub-bank of the first bank, the first sub-bank of the second bank and the second sub-bank of the second bank, the first sub-bank of the third bank and the second sub-bank of the third bank, and the first sub-bank of the fourth bank and the second sub-bank of the fourth bank being diagonally arranged with respect to a center of the plurality of banks.

6. The semiconductor memory device according to claim 4, wherein the LIO sense amplifiers are implemented by more than two kinds of LIO sense amplifiers, each kind having a different driving capability, and each sub-bank of each bank that is farther away from the GIO sense amplifier than another sub-bank has a greater driving capability than that other sub-bank.

* * * * *